United States Patent
Adachi et al.

(10) Patent No.: US 9,224,517 B2
(45) Date of Patent: *Dec. 29, 2015

(54) PASTE COMPOSITION FOR ELECTRODE AND PHOTOVOLTAIC CELL

(75) Inventors: Shuichiro Adachi, Tsukuba (JP); Masato Yoshida, Tsukuba (JP); Takeshi Nojiri, Tsukuba (JP); Mitsunori Iwamuro, Tsukuba (JP); Keiko Kizawa, Tsukuba (JP); Takuya Aoyagi, Hitachi (JP); Hiroki Yamamoto, Hitachi (JP); Takashi Naito, Hitachi (JP); Takahiko Kato, Hitachi (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 372 days.

This patent is subject to a terminal disclaimer.

(21) Appl. No.: 13/439,955

(22) Filed: Apr. 5, 2012

(65) Prior Publication Data

US 2012/0260988 A1    Oct. 18, 2012

Related U.S. Application Data

(60) Provisional application No. 61/472,896, filed on Apr. 7, 2011.

(51) Int. Cl.
   *H01M 4/88*   (2006.01)
   *H01B 1/22*   (2006.01)
   *H01L 31/0224*  (2006.01)

(52) U.S. Cl.
   CPC .......... *H01B 1/22* (2013.01); *H01L 31/022425* (2013.01); *Y02E 10/50* (2013.01)

(58) Field of Classification Search
   CPC ................. H01L 31/022425; H01L 31/02167; H01L 31/026; H01B 1/22
   USPC ........ 252/182.1, 512; 136/256, 265; 429/188; 361/306.3; 228/220
   See application file for complete search history.

(56) References Cited

U.S. PATENT DOCUMENTS

| 5,066,456 A | 11/1991 | Ballentine et al. |
| 5,855,820 A | 1/1999 | Chan |
| 2001/0051387 A1 | 12/2001 | Nakagawa |
| 2005/0006443 A1* | 1/2005 | Hattori et al. ................ 228/220 |
| 2007/0221270 A1 | 9/2007 | Watsuji |
| 2008/0178930 A1 | 7/2008 | Konno |
| 2008/0199772 A1* | 8/2008 | Amatucci et al. ............ 429/188 |
| 2009/0101210 A1 | 4/2009 | Carroll |

(Continued)

FOREIGN PATENT DOCUMENTS

| CN | 102870167 A | 1/2013 |
| EP | 2698827 A1 | 2/2014 |

(Continued)

OTHER PUBLICATIONS

Office Action issued Apr. 5, 2013, in U.S. Appl. No. 13/012,920.

(Continued)

*Primary Examiner* — Khanh Tuan Nguyen
(74) *Attorney, Agent, or Firm* — Fitch, Even, Tabin and Flannery LLP (57) ABSTRACT

A paste composition for an electrode, the paste composition comprising: phosphorous-containing copper alloy particles in which the content of phosphorous is from 6% by mass to 8% by mass; glass particles; a solvent; and a resin.

9 Claims, 3 Drawing Sheets

(56) References Cited

U.S. PATENT DOCUMENTS

| | | |
|---|---|---|
| 2009/0140217 A1 | 6/2009 | Wang |
| 2009/0255584 A1 | 10/2009 | Carroll |
| 2009/0266409 A1 | 10/2009 | Wang |
| 2009/0288697 A1 | 11/2009 | Shimizu |
| 2010/0096002 A1 | 4/2010 | Hayashi |
| 2010/0096014 A1* | 4/2010 | Iida et al. ............. 136/265 |
| 2010/0243048 A1 | 9/2010 | Laudisio |
| 2011/0083874 A1 | 4/2011 | Kuroki |
| 2011/0277831 A1* | 11/2011 | Yoshida et al. ......... 136/256 |
| 2012/0067415 A1* | 3/2012 | Tachizono et al. ....... 136/256 |
| 2013/0048047 A1 | 2/2013 | Fujii |

FOREIGN PATENT DOCUMENTS

| | | | |
|---|---|---|---|
| JP | 62-022868 A | 1/1987 | |
| JP | 64-057762 A | 3/1989 | |
| JP | 5-29639 A | 2/1993 | |
| JP | 5-159621 A | 6/1993 | |
| JP | 11-162859 A | 6/1999 | |
| JP | 2001-110232 A | 4/2001 | |
| JP | 2001-223738 A | 8/2001 | |
| JP | 2003-123533 A | 4/2003 | |
| JP | 2004-79211 A | 3/2004 | |
| JP | 2004-217952 A | 8/2004 | |
| JP | 2005-222737 * | 8/2005 | ............. H01B 1/22 |
| JP | 2005-222737 A | 8/2005 | |
| JP | 2005-242724 A | 9/2005 | |
| JP | 2005-277058 A | 10/2005 | |
| JP | 2005-314755 A | 11/2005 | |
| JP | 2006-004905 A | 1/2006 | |
| JP | 2006-096988 A | 4/2006 | |
| JP | 2006-204512 A | 8/2006 | |
| JP | 2006-290635 A | 10/2006 | |
| JP | 2006-313744 A | 11/2006 | |
| JP | 2008-108629 A | 5/2008 | |
| JP | 2008-138969 A | 6/2008 | |
| JP | 2008-226816 A | 9/2008 | |
| JP | 2008-251324 A | 10/2008 | |
| JP | 4158713 B2 | 10/2008 | |
| JP | 2008-285589 A | 11/2008 | |
| JP | 2009-099443 A | 5/2009 | |
| JP | 2010013730 A | 1/2010 | |
| JP | 201059469 A | 3/2010 | |
| JP | 2010-144138 A | 7/2010 | |
| JP | 2010-161331 A | 7/2010 | |
| JP | 2010-186862 A | 8/2010 | |
| JP | 2010-287821 A | 12/2010 | |
| WO | WO-2008/078374 A1 | 7/2008 | |
| WO | WO-2010/109541 A1 | 9/2010 | |
| WO | WO 2010-109905 A1 * | 9/2010 | ............. C03C 8/04 |
| WO | 2011090211 A1 | 7/2011 | |
| WO | WO-2012/033059 A1 | 3/2012 | |

OTHER PUBLICATIONS

Office Action issued Sep. 13, 2012, in U.S. Appl. No. 13/013,293.
Office Action issued Mar. 7, 2013, in U.S. Appl. No. 13/013,293.
Office Action issued Aug. 22, 2013, in U.S. Appl. No. 13/013,293.
Office Action issued Sep. 20, 2013, in U.S. Appl. No. 13/444,838.
Office Action issued Sep. 20, 2013, in U.S. Appl. No. 13/444,834.
Office Action issued Mar. 27, 2013, in U.S. Appl. No. 13/012,901.
U.S. Appl. No. 13/012,920, filed Jan. 25, 2011.
U.S. Appl. No. 13/012,947, filed Jan. 25, 2011.
U.S. Appl. No. 13/012,901, filed Jan. 25, 2011.
U.S. Appl. No. 13/013,293, filed Jan. 25, 2011.
U.S. Appl. No. 13/013,230, filed Jan. 25, 2011.
U.S. Appl. No. 13/444,838, filed Apr. 11, 2012.
U.S. Appl. No. 13/444,834, filed Apr. 11, 2012.
Xu et al., Material Letters, 57 (2003) 3987-3991.
"Sunlight Power Generation, Newest Technology and Systems" edited by Yoshihiro Hamakawa, CMC Books, 2001, pp. 26-27.
Office Action issued Aug. 5, 2013, in Chinese Patent Application No. 201280001595.1.
Office Action issued Feb. 27, 2014, in Chinese Patent Application No. 201280001595.1.
European Supplementary Search Report, mailed Dec. 17, 2014, in Japanese Application No. 2011-160629.

* cited by examiner

PASTE COMPOSITION FOR ELECTRODE AND PHOTOVOLTAIC CELL

CROSS REFERENCE TO RELATED APPLICATIONS

This application claims priority under 35 U.S.C. 119(e) to Provisional U.S. Patent Application No. 61/472,896, filed Apr. 7, 2011, the disclosure of which is incorporated by reference herein.

BACKGROUND OF THE INVENTION

1. Field of the Invention

The present invention relates to a paste composition for an electrode and a photovoltaic cell.

2. Description of the Related Art

Generally, a crystalline silicon photovoltaic cell is provided with a surface electrode, in which the wiring resistance or contact resistance of the surface electrode is related to a voltage loss associated with conversion efficiency, and further, the wiring width or shape has an influence on the amount of the incident sunlight (see, for example, "Sunlight Power Generation, Newest Technology and Systems", edited by Yoshihiro Hamakawa, CMC Books, 2001, p. 26-27).

The surface electrode of a photovoltaic cell is usually formed in the following manner. That is, a conductive composition is applied onto an n-type semiconductor layer, which is formed by thermally diffusing phosphorous and the like at a high temperature on the light-receiving surface side of a p-type silicon substrate, by screen printing or the like, and sintered at a high temperature of 800 to 900° C., thereby forming a surface electrode. This conductive composition for forming the surface electrode includes conductive metal powders, glass particles, various additives, and the like.

As the conductive metal powders, silver powders are generally used, but the use of metal powders other than silver powders has been investigated for various reasons. For example, a conductive composition capable of forming an electrode for a photovoltaic cell, including silver and aluminum, is disclosed (see, for example, Japanese Patent Application Laid-Open (JP-A) No. 2006-313744). In addition, a composition for forming an electrode, including metal nanoparticles including silver and metal particles other than silver, is disclosed (see, for example, JP-A No. 2008-226816).

SUMMARY OF THE INVENTION

An embodiment of the present invention is a paste composition for an electrode, the paste composition containing:

phosphorous-containing copper alloy particles in which the content of phosphorous is from 6% by mass to 8% by mass;

glass particles;

a solvent; and a resin.

The glass particles preferably have a glass softening point of 600° C. or lower and a crystallization starting temperature of higher than 600° C.

The paste composition for an electrode preferably further contains silver particles, and the content of the silver particles is preferably 5% by mass to 65% by mass, with respect to a total content of the phosphorous-containing copper alloy particles and the silver particles is 100% mass.

The total content of the phosphorous-containing copper alloy particles and the silver particles is preferably 70% by mass to 94% by mass, the content of the glass particles is preferably 0.1% by mass to 10% by mass, and the total content of the solvent and the resin is preferably 3% by mass to 29.9% by mass, with respect to the paste composition.

A second embodiment of the present invention is a photovoltaic cell having an electrode, in which the electrode is formed by sintering the paste composition for an electrode, after the paste composition has been applied to a silicon substrate.

BRIEF DESCRIPTION OF THE DRAWINGS

FIG. 4($a$) is a perspective view showing the AA cross-sectional constitution of the back contact-type photovoltaic cell according to the present invention. FIG. 4($b$) is a plane view showing the back surface side electrode structure of the back contact-type photovoltaic cell according to the present invention.

DETAILED DESCRIPTION OF THE INVENTION

In the present specification, "to" denotes a range including each of the minimum value and the maximum value of the values described before and after the reference.

<Paste Composition for Photovoltaic Cell Electrode>

A paste composition for an electrode of the present invention includes phosphorous-containing copper alloy particles in which the content of phosphorous is from 6% by mass to 8% by mass; at least one kind of glass particles; at least one kind of solvents; and at least one kind of resins. By adopting such a constitution, it is possible to form an electrode having a low resistivity by inhibiting the oxidation of copper even at a time of sintering.

Silver, which is generally used to form an electrode, is a noble metal and, in view of problems regarding resources and also from the viewpoint that the ore is expensive, proposals for a paste material which replaces the silver-containing conductive composition (silver-containing paste) are desirable. As a promising material for replacing silver, there is copper which is employed in semiconductor wiring materials. Copper is abundant as a resource and the cost of the metal is inexpensive, about as low as one hundredth the cost of silver. However, copper is a material susceptible to oxidation at high temperatures of 200° C. or higher. For example, in the composition for forming an electrode described in Patent Document 2, in which the composition includes a copper as a conductive metal, in order to form the electrode by sintering of the composition it is necessary to conduct a special process in which the composition is sintered under an atmosphere of nitrogen or the like.

According to the present invention, there is provided a paste composition for an electrode, which is capable of forming an electrode having a low resistivity by inhibiting the oxidation of copper at a time of sintering, and a photovoltaic cell having an electrode in which the electrode is formed by using the paste composition for an electrode.

(Phosphorous-Containing Copper Alloy Particle)

A paste composition for an electrode of the present invention includes a phosphorous-containing copper alloy particle in which the content of phosphorous is from 6% by mass to 8% by mass The content of phosphorous in the phosphorous-containing copper alloy is 6% by mass to 8% by mass, preferably 6.3% by mass to 7.8% by mass, and more preferably 6.5% by mass to 7.5% by mass, from the viewpoint of the oxidation resistance and the low resistivity. By setting the content of phosphorous in the phosphorous-containing copper alloy to 8% by mass or less, the low resistivity can be more effectively attained and the productivity of the phosphorous in the phosphorous-containing copper alloy is excellent; and by setting the content of phosphorous in the phosphorous-containing copper alloy to 6% by mass or more, the oxidation resistance can be more effectively attained.

As the phosphorous-containing copper alloy, a brazing material called copper phosphorus brazing (phosphorous concentration: usually approximately 7% by mass) is known. The copper phosphorus brazing is used as a copper to copper bonding agent. By using the phosphorous-containing copper alloy particle in the paste composition for an electrode of the present invention, the reducing property of phosphorus against oxidized copper can be utilized to form an electrode having excellent oxidation resistance and low resistivity. Furthermore, it becomes possible to sinter the electrode at a low temperature, and as a result, an effect of reducing a process cost can be attained.

The phosphorous-containing copper alloy particle is an alloy including copper and phosphorous, and it may include other atoms. Examples of other atoms include Ag, Mn, Sb, Si, K, Na, Li, Ba, Sr, Ca, Mg, Be, Zn, Pb, Cd, Tl, V, Sn, Al, Zr, W, Mo, Ti, Co, Ni, and Au.

Further the content of other atoms contained in the phosphorous-containing copper alloy particle may be, for example, 3% by mass or less in the phosphorous-containing copper alloy particle, and from the viewpoint of the oxidation resistance and the low resistivity, it is preferably 1% by mass or less.

The phosphorous-containing copper alloy particles may be used singly or in combination of two or more kinds thereof.

The particle diameter of the phosphorous-containing copper alloy particles is not particularly limited, and it is preferably from 0.4 µm to 10 µm, and more preferably from 1 µm to 7 µm in terms of a particle diameter when the cumulative mass is 50% (hereinafter abbreviated as "D50% in some cases). By setting the particle diameter to 0.4 µm or more, the oxidation resistance is improved more effectively. Further, by setting the particle diameter to 10 µm or less, the contact area at which the phosphorous-containing copper alloy particles contact each other in the electrode increases, whereby the resistivity is reduced more effectively. The particle diameter of the phosphorous-containing copper alloy particle is measured by means of a MICROTRAC particle size distribution analyzer (MT3300 type, manufactured by Nikkiso Co., Ltd.).

In addition, the shape of the phosphorous-containing copper alloy particle is not particularly limited, and it may be any one of a spherical shape, a flat shape, a block shape, a plate shape, a scale-like shape, and the like. From the viewpoint of oxidation resistance and low resistivity, it is preferably a spherical shape, a flat shape, or a plate shape.

The content of the phosphorous-containing copper alloy particles, or the total content of the phosphorous-containing copper alloy particles and the silver particles when including silver particles as described later may be, for example, from 70 to 94% by mass, and from the viewpoint of oxidation resistance and low resistivity, preferably from 72 to 90% by mass, and more preferably from 74 to 88% by mass, based on the paste composition for an electrode of the present invention.

The phosphorous copper alloy may be prepared by a typically used method. Further, the phosphorous-containing copper alloy particles may be prepared by a general method for preparing metal powders using a phosphorous-containing copper alloy that is prepared so as to give a desired phosphorous content with a general method, for example, a water atomization method. The water atomization method is described in Handbook of Metal (Maruzen) or the like.

Specifically, for example, a desired phosphorous-containing copper alloy particle may be prepared by dissolving a phosphorous-containing copper alloy, forming a powder by a nozzle spray, drying the obtained powders, and classifying them. Further, a phosphorous-containing copper alloy particle having a desired particle diameter may be prepared by appropriately selecting the classification condition.

(Glass Particles)

The paste composition for an electrode according to the present invention includes at least one kind of glass particles. By including the glass particles in the paste composition for an electrode, adhesion between the electrode portion and the substrate is improved. Furthermore, a silicon nitride film which is an anti-reflection film is removed by a so-called fire-through at an electrode-forming temperature, and an ohmic contact between the electrode and the silicon substrate is formed.

As the glass particles, any known glass particles in the related art may be used without a particular limitation, provided the glass particles are softened or melted at an electrode-forming temperature to contact with the silicon nitride, thereby oxidizing the silicon nitride, incorporating the oxidized silicon dioxide thereof and then removing the silicon nitride film.

In the present invention, the glass particles preferably contain glass having a glass softening point of 600° C. or lower and a crystallization starting temperature of higher than 600° C., from the viewpoint of the oxidation resistance and the low resistivity of the electrode. Further, the glass softening point is measured by a general method using a ThermoMechanical Analyzer (TMA), and the crystallization starting temperature is measured by a general method using a ThermoGravimetry/Differential Thermal Analyzer (TG/DTA).

The glass particles generally included in the paste composition for an electrode may be constituted with lead-containing glass, at which silicon dioxide is efficiently captured. Examples of such the lead-containing glass include those described in Japanese Patent 03050064 and the like, which may be preferably used in the present invention.

Furthermore, in the present invention, in consideration of an effect on the environment, it is preferable to use lead-free glass which does not substantially contain lead. Examples of the lead-free glass include lead-free glass described in Paragraphs 0024 to 0025 of JP-A No. 2006-313744, and lead-free glass described in JP-A No. 2009-188281 and the like, and it is also preferable to appropriately select one from the lead-free glass as above for the present invention.

Examples of a glass component to be used in the paste composition for an electrode of the present invention include silicon dioxide ($SiO_2$), phosphorus oxide ($P_2O_5$), aluminum oxide ($Al_2O_3$), boron oxide ($B_2O_3$), vanadium oxide ($V_2O_5$), potassium oxide ($K_2O$), bismuth oxide ($Bi_2O_3$), sodium oxide ($Na_2O$), lithium oxide ($Li_2O$), barium oxide (BaO), strontium oxide (SrO), calcium oxide (CaO), magnesium oxide (MgO), beryllium oxide (BeO), zinc oxide (ZnO), lead oxide (PbO), cadmium oxide (CdO), tin oxide (SnO), zirconium oxide ($ZrO_2$), tungsten oxide ($WO_3$), molybdenum oxide ($MoO_3$), lanthanum oxide ($La_2O_3$), niobium oxide ($Nb_2O_5$), tantalum oxide ($Ta_2O_5$), yttrium oxide ($Y_2O_3$), titanium oxide (TiO$_2$), germanium oxide (GeO$_2$), tellurium oxide (TeO$_2$), lutetium oxide (Lu$_2$O$_3$), antimony oxide (Sb$_2$O$_3$), copper oxide (CuO), iron oxide (FeO), silver oxide (AgO) and manganese oxide (MnO).

Among these, it is preferred to use at least one selected from SiO$_2$, P$_2$O$_5$, Al$_2$O$_3$, B$_2$O$_3$, V$_2$O$_5$, Bi$_2$O$_3$, ZnO and PbO. Specific examples of the glass component include one which contains SiO$_2$, PbO, B$_2$O$_3$, Bi$_2$O$_3$ and Al$_2$O$_3$. In the case of such glass particle, since the softening point is effectively lowered and the wettabilities with the phosphorous-containing copper alloy particle and the silver particle added as required are improved, sintering among the above-described particles in the sintering process is advanced, so that an electrode having a low resistivity can be formed.

On another front, from the viewpoint of attaining a low contact resistivity, a glass particle containing diphosphorus pentoxide (phosphate glass, P$_2$O$_5$-based glass particle) is preferred and a glass particle which further contains divanadium pentoxide in addition to diphosphorus pentoxide (P$_2$O$_5$—V$_2$O$_5$-based glass particle) is more preferred. By further containing divanadium pentoxide, the oxidation resistance is more improved and the resistivity of the electrode is further reduced. This can be considered attributable to, for example, a decrease in the glass softening point attained by the further addition of divanadium pentoxide. In cases where a diphosphorus pentoxide-divanadium pentoxide-based glass particle (P$_2$O$_5$—V$_2$O$_5$-based glass particle) is used, the content of divanadium pentoxide is preferably not less than 1% by mass, more preferably 1 to 70% by mass, based on the total mass of the glass.

The particle diameter of the glass particles is not particularly limited, and it is preferably from 0.5 μm to 10 μm, and more preferably from 0.8 μm to 8 μm in terms of a particle diameter when the cumulative mass is 50% ("D50%"). By setting the particle diameter to 0.5 μm or more, the operation performance is improved when the paste composition for an electrode is prepared. Further, by setting the particle diameter to 10 μm or less, the glass particles are dispersed more uniformly in the paste composition for an electrode, a fire-through effectively occurs during sintering process, and adhesion to silicon substrate is improved.

In addition, the shape of the glass particle is not particularly limited, and it may be any one of a spherical shape, a flat shape, a block shape, a plate shape, a scale-like shape, and the like. From the viewpoint of oxidation resistance and low resistivity, it is preferably a spherical shape, a flat shape, or a plate shape.

In the paste composition for an electrode of the present invention, the ratio of the particle diameter of the glass particle (D50%) with respect to the particle diameter of the phosphorous-containing copper alloy particle (D50%) is preferably 0.05 to 100, and more preferably 0.1 to 20. By including the glass particles having a diameter in this range, oxidation resistance, low resistivity of the electrode, and low contact resistance can be more effectively attained.

The content of the glass particles is preferably from 0.1 to 10% by mass, more preferably from 0.5 to 8% by mass, and even more preferably from 1 to 7% by mass, based on the total mass of the paste composition for an electrode. By including the glass particles at a content in this range, oxidation resistance, low resistivity of the electrode, and low contact resistance can be more effectively attained.

(Solvent and Resin)

The paste composition for an electrode according to the present invention includes at least one kind of solvents and at least one kind of resins, thereby enabling adjustment of the liquid physical properties (for example, viscosity and surface tension) of the paste composition for an electrode of the present invention due to the application method selected when the paste composition is provided on the silicon substrate.

The solvent is not particularly limited. Examples thereof include hydrocarbon-based solvents such as hexane, cyclohexane, and toluene; chlorinated hydrocarbon-based solvents such as dichloroethylene, dichloroethane, and dichlorobenzene; cyclic ether-based solvents such as tetrahydrofuran, furan, tetrahydropyran, pyran, dioxane, 1,3-dioxolane, and trioxane; amide-based solvents such as N,N-dimethylformamide and N,N-dimethylacetamide; sulfoxide-based solvents such as dimethylsulfoxide, diethylsulfoxide; ketone-based solvents such as acetone, methyl ethyl ketone, diethyl ketone, and cyclohexanone; alcohol-based compounds such as ethanol, 2-propanol, 1-butanol, and diacetone alcohol; polyhydric alcohol ester-based solvents such as 2,2,4-trimethyl-1,3-pentanediol monoacetate, 2,2,4-trimethyl-1,3-pentanediol monopropiorate, 2,2,4-trimethyl-1,3-pentanediol monobutyrate, 2,2,4-trimethyl-1,3-pentanediol monoisobutyrate, 2,2,4-triethyl-1,3-pentanediol monoacetate, ethylene glycol monobutyl ether acetate, and diethylene glycol monobutyl ether acetate; polyhydric alcohol ether-based solvents such as butyl cellosolve and diethylene glycol diethyl ether; terpene-based solvents such as α-terpinene, α-terpineol, myrcene, alloocimene, limonene, dipentene, α-pinene, β-pinene, terpineol, carvone, ocimene, and phellandrene; and mixtures thereof.

As the solvent in the present invention from the viewpoint of applicability and printability when forming the paste composition for an electrode on a silicon substrate, at least one selected from polyhydric alcohol ester-based solvents, terpene-based solvents, and polyhydric alcohol ether-based solvents is preferred, and at least one selected from polyhydric alcohol ester-based solvents and terpene-based solvents is more preferred.

In the present invention, the solvents may be used singly or in a combination of two or more kinds thereof.

Furthermore, as the resin, a resin that is usually used in the art may be used without any limitation as long as it is a resin that is thermally decomposable by sintering. Specific examples thereof include cellulose-based resins such as methyl cellulose, ethyl cellulose, carboxymethyl cellulose, and nitrocellulose; polyvinyl alcohols; polyvinyl pyrrolidones; acryl resins; vinyl acetate-acrylic ester copolymers; butyral resins such as polyvinyl butyral; alkyd resins such as phenol-modified alkyd resins and castor oil fatty acid-modified alkyd resins; epoxy resins; phenol resins; and rosin ester resins.

As the resin in the present invention, from the viewpoint of the loss at a time of sintering, at least one selected from cellulose-based resins and acryl resins are preferred, and at least one selected from cellulose-based resins is more preferred.

In the present invention, the resins may be used singly or in combination of two or more kinds thereof.

Further, the weight average molecular weight of the above-described resin in the present invention is preferably from 5,000 to 500,000. When the weight average molecular weight of the resin is not less than 5,000, an increase in the viscosity of the paste composition for an electrode can be suppressed. This can be considered because, for example, the phenomenon of particle aggregation, which is caused by insufficient steric repulsion when the resin is adsorbed on the phosphorous-containing copper alloy particle, is suppressed. Meanwhile, when the weight average molecular weight of the resin is not higher than 500,000, mutual aggregation of the resin in the solvent can be suppressed, so that the phenomenon of increase in the viscosity of the paste composition for an electrode can be suppressed. In addition, by controlling the weight average molecular weight of the resin at an appropriate level, an increase in the combustion temperature of the resin can be inhibited and, therefore, a residual foreign substance caused by incomplete combustion of the resin during sintering of the paste composition for an electrode can be prevented, so that an electrode having a low resistivity can be attained.

In the paste composition for an electrode of the present invention, the contents of the solvent and the resin can be appropriately selected in accordance with desired liquid physical properties and the kinds of the solvent and the resin to be used. For example, the total content of the solvent and the resin is preferably 3 to 29.9% by mass, more preferably 5 to 25% by mass, and even more preferably 7 to 20% by mass, based on the total mass of the paste composition for an electrode.

By setting the contents of the solvent and the resin in the above-described ranges, the provision suitability becomes better when the paste composition for an electrode is provided on a silicon substrate, and thus, an electrode having a desired width and a desired height can be formed more easily.

(Silver Particles)

The paste composition for an electrode of the present invention preferably further includes a silver particle. By including the silver particle, the oxidation resistance is further improved, and the resistivity as the electrode is further reduced. In addition, an effect that the solder connectivity is improved when forming a photovoltaic cell module can be obtained. This can be considered to be as follows, for example.

Generally, in a temperature region from 600° C. to 900° C. that is an electrode-forming temperature region, a small amount of a solid solution of silver in copper, and a small amount of a solid solution of copper in silver are generated, and a layer of the copper-silver solid solution (solid solution region) is formed at an interface between copper and silver. It is thought that when a mixture of the phosphorous-containing copper alloy particles and the silver particles is heated at a high temperature, and then slowly cooled to room temperature, the solid solution region is not generated, but taking into consideration that cooling is done for a few seconds from a high temperature region to a normal temperature when forming an electrode, it is thought that the layer of the solid solution at a high temperature covers the surface of the silver particles and the phosphorous-containing copper alloy particles as a non-equilibrium solid solution phase or as an eutectic structure of copper and silver. It can be thought that such the copper-silver solid solution layer contributes to the oxidation resistance of the phosphorous-containing copper alloy particle at an electrode-forming temperature.

Silver constituting the silver particles may contain other atoms which are inevitably incorporated. Examples of other atoms which are inevitably incorporated include Sb, Si, K, Na, Li, Ba, Sr, Ca, Mg, Be, Zn, Pb, Cd, Tl, V, Sn, Al, Zr, W, Mo, Ti, Co, Ni, and Au.

The particle diameter of the silver particle of the present invention is not particularly limited, but it is preferably 0.4 to 10 µm, and more preferably 1 to 7 µm in terms of a particle diameter when the cumulative mass is 50% ("D50%"). By setting the particle diameter to 0.4 µm or more, the oxidation resistance is improved more effectively. Further, by setting the particle diameter to 10 µm or less, the contact area between the metal particles such as silver particles and phosphorous-containing copper alloy particles in the electrode increases, and thus, the resistivity is more effectively reduced.

In the paste composition for an electrode of the present invention, the relationship between the particle diameter of the phosphorous-containing copper alloy particle (D50%) and the particle diameter of the silver particle (D50%) is not particularly limited, but it is preferable that the particle diameter (D50%) of one is smaller than the particle diameter (D50%) of the other, and it is more preferable that the ratio of the particle diameter of one to the particle diameter of the other be 1 to 10. Consequently, the resistivity of the electrode is more effectively reduced. It is thought that this is caused from increase in the contact area between the metal particles such as phosphorous-containing copper alloy particles and silver particles in the electrode.

Moreover, the content of the silver particles in the paste composition for an electrode of the present invention is preferably 8.4 to 85.5% by mass, and more preferably 8.9 to 80.1% by mass, based on the paste composition for an electrode, from the viewpoint of the oxidation resistance and the low resistivity of the electrode.

Moreover, in the present invention, from the viewpoint of the oxidation resistance, the low resistivity of the electrode, and reduction in cost, the content of the silver particles is preferably 5 to 65% by mass, more preferably 7 to 60% by mass, and even more preferably 10 to 55% by mass, with respect to a total content of the phosphorous-containing copper alloy particles and the silver particles is 100% mass.

Moreover, in the paste composition for an electrode of the present invention, from the viewpoint of the oxidation resistance, the low resistivity of the electrode, and the applicability on a silicon substrate, the total content of the phosphorous-containing copper alloy particles and the silver particles is preferably 70 to 94% by mass, and more preferably 74 to 88% by mass. By setting the total content of the phosphorous-containing copper alloy particles and the silver particles to 70% by mass or more, a viscosity that is suitable for providing the paste composition for an electrode can be easily attained. Also, by setting the total content of the phosphorous-containing copper alloy particles and the silver particles to 94% by mass or less, the occurrence of abrasion when providing the paste composition for an electrode can be more effectively inhibited.

Moreover, in the paste composition for an electrode of the present invention, from the viewpoint of the oxidation resistance and the low resistivity of the electrode, it is preferable that the total content of the phosphorous-containing copper alloy particles and the silver particles be 70 to 94% by mass, the content of the glass particles be 0.1 to 10% by mass, and the total content of the solvent and the resin be 3 to 29.9% by mass; it is more preferable that the total content of the phosphorous-containing copper alloy particles and the silver particles be 74 to 88% by mass, the content of the glass particles be 0.5 to 8% by mass, and the total content of the solvent and the resin be 7 to 20% by mass; and it is still more preferable that the total content of the phosphorous-containing copper alloy particles and the silver particles be 74 to 88% by mass, the content of the glass particles be 1 to 7% by mass, and the total content of the solvent and the resin be 7 to 20% by mass.

(Flux)

The paste composition for an electrode may include at least one kind of fluxes. By including the flux, the oxidation resistance is further improved, and the resistivity of the electrode to be formed is further reduced. Also, an effect that adhesion between the electrode material and the silicon substrate is improved can be attained.

The flux in the present invention is not particularly limited as long as it can inhibit the formation of an oxide film on the surface of the phosphorous-containing copper alloy particles. Specific preferable examples of the flux include fatty acids, boric acid compounds, fluoride compounds, and fluoroborate compounds.

More specific examples thereof include lauric acid, myristic acid, palmitic acid, stearic acid, sorbic acid, stearol acid, boron oxide, potassium borate, sodium borate, lithium borate, potassium fluoroborate, sodium fluoroborate, lithium fluoroborate, acidic potassium fluoride, acidic sodium fluoride, acidic lithium fluoride, potassium fluoride, sodium fluoride, and lithium fluoride.

Among those, from the viewpoint of heat resistance at a time of sintering the electrode material (a property that the flux is not volatilized at a low sintering temperature) and complement of the oxidation resistance of the phosphorous-containing copper alloy particles, particularly preferable examples of the flux include potassium borate and potassium fluoroborate.

In the present invention, these fluxes can be respectively used singly or in combination of two or more kinds thereof.

Furthermore, the content of the flux in the paste composition for an electrode of the present invention is preferably from 0.1 to 5% by mass, more preferably from 0.3 to 4% by mass, even more preferably from 0.5 to 3.5% by mass, still more preferably from 0.7 to 3% by mass, and particularly preferably from 1 to 2.5% by mass, based on the total mass of the paste composition for an electrode, from the viewpoint of effectively exhibiting the oxidation resistance of the phosphorous-containing copper alloy particles and from the viewpoint of reducing the porosity of a portion from which the flux is removed at a time of completion of the sintering of the electrode material.

(Other Components)

Furthermore, the paste composition for an electrode of the present invention can include, in addition to the above-described components, other components generally used in the art, if necessary. Examples of other components include a plasticizer, a dispersant, a surfactant, an inorganic binder, a metal oxide, a ceramic, and an organic metal compound.

The method for preparing the paste composition for an electrode of the present invention is not particularly limited. The paste composition for an electrode of the present invention may be prepared by dispersing and mixing phosphorous-containing copper alloy particles, glass particles, a solvent, a resin, silver particles to be added, if necessary, and the like, using a typically used dispersing/mixing method.

<Method for Producing Electrode Using Paste Composition for Electrode>

As a method for producing an electrode by using the paste composition for an electrode of the present invention, an electrode may be formed in a desired region by providing the above-described paste composition for an electrode to the region where an electrode is to be formed and then drying and sintering the resultant. By using the above-described paste composition for an electrode, an electrode having a low resistivity can be formed even when the sintering treatment is performed in the presence of oxygen (e.g. in the atmosphere).

Specifically, for example, in cases where an electrode for a photovoltaic cell is formed using the above-described paste composition for an electrode, a photovoltaic cell electrode having a low resistivity can be formed in a desired shape by providing the paste composition for an electrode to a silicon substrate in a desired shape and then drying and sintering the resultant. Further, by using the above-described paste composition for an electrode, an electrode having a low resistivity can be formed even when the sintering treatment is performed in the presence of oxygen (e.g. in the atmosphere).

Examples of the method for providing the paste composition for an electrode on a silicon substrate include screen printing, an ink-jet method, and a dispenser method, and from the viewpoint of the productivity, application by screen printing is preferred.

When the paste composition for an electrode of the present invention is applied by screen printing, it is preferable that the viscosity be in the range from 80 to 1000 Pa·s. Further, the viscosity of the paste composition for an electrode is measured using a Brookfield HBT viscometer at 25° C.

The amount of the paste composition for an electrode to be applied may be selected as appropriate in accordance with the size of the electrode to be formed. For example, the paste composition for an electrode may be applied in an amount of 2 to 10 g/m$^2$, and preferably 4 to 8 g/m$^2$.

Moreover, as a heat treatment condition (sintering condition) when forming an electrode using the paste composition for an electrode of the present invention, heat treatment conditions generally used in the art may be applied.

Generally, the heat treatment temperature (sintering temperature) is 800 to 900° C., but when using the paste composition for an electrode of the present invention, a heat treatment condition at a lower temperature may be applied, and for example, an electrode having excellent characteristics may be formed at a heat treatment temperature of 600 to 850° C.

In addition, the heat treatment time may be appropriately selected according to the heat treatment temperatures, and it may be, for example, 1 second to 20 seconds.

As a heat treatment apparatus, any apparatus may be employed as appropriate as long as it is capable of heating the paste composition to the above-described temperature, and examples of such apparatus include infrared heating ovens and tunnel ovens. In an infrared heating oven, electrical energy is directly charged to the material to be heated in the form of an electromagnetic wave and converted into thermal energy; therefore, an infrared heating oven is highly efficient and capable of attaining rapid heating in a short period of time. Further, since no combustion product is generated and the heating is non-contact heating, contamination of the produced electrode can be prevented. In a tunnel oven, a sample is sintered while being conveyed automatically and continuously from an inlet to an outlet; therefore, by segmenting the oven and controlling the conveying speed, uniform sintering can be attained. From the viewpoint of the power generation performance of the resulting photovoltaic cell, it is preferred that the heat treatment be performed by a tunnel oven.

<Photovoltaic Cell>

The photovoltaic cell of the present invention has an electrode formed by sintering the paste composition for an electrode, after the paste composition has been applied to the silicon substrate. As a result, a photovoltaic cell having excellent properties can be obtained, and the productivity of the photovoltaic cell is excellent.

Hereinbelow, specific examples of the photovoltaic cell of the present invention will be described with reference to the drawings, but the present invention is not limited thereto.

Figure 1:
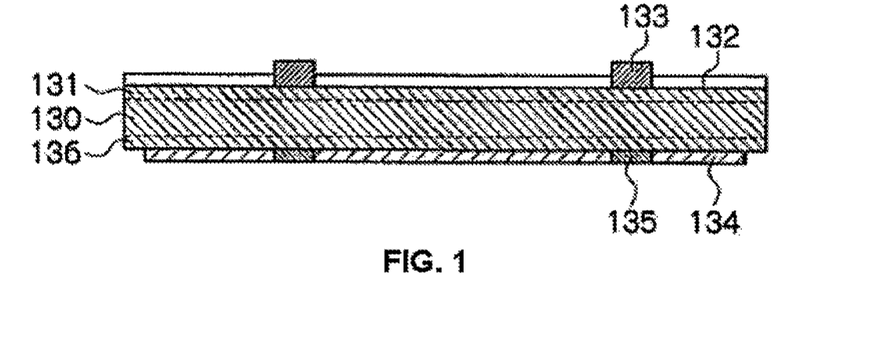
FIG. 1 is a cross-sectional view of the photovoltaic cell according to the present invention.
Figure 2:
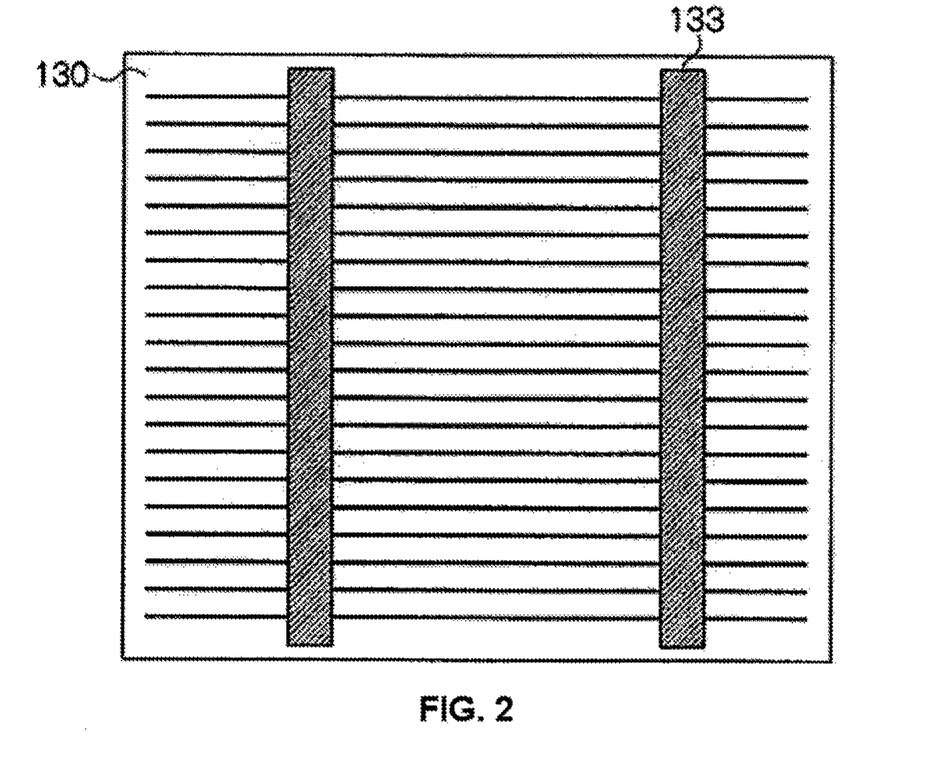
FIG. 2 is a plane view showing the light-receiving surface side of the photovoltaic cell according to the present invention.
Figure 3:
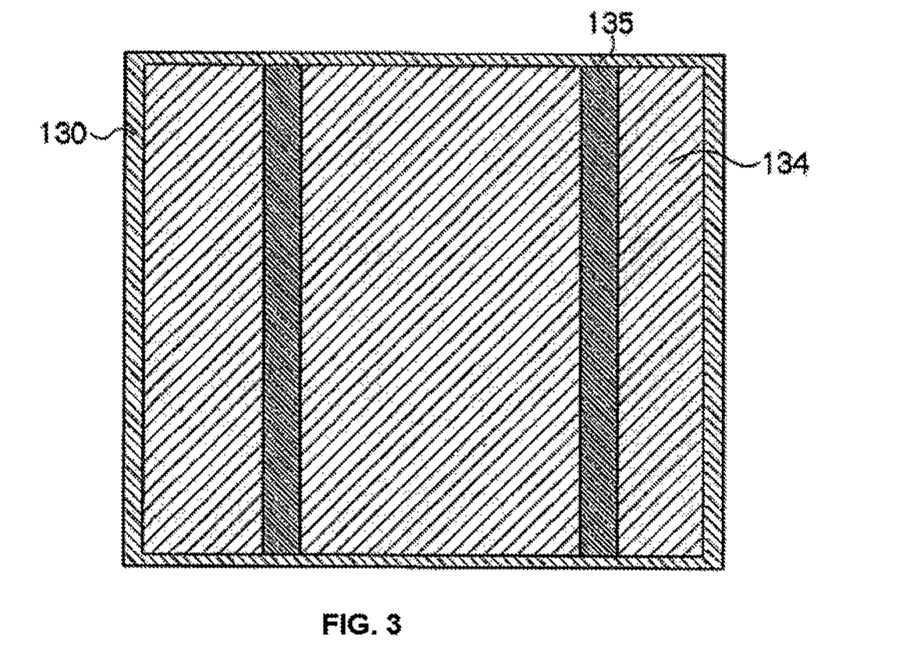
FIG. 3 is a plane view showing the back surface side of the photovoltaic cell according to the present invention.

A cross-sectional view, and summaries of the light-receiving surface and the back surface of one example of the representative photovoltaic cell elements are shown in FIGS. 1, 2, and 3, respectively.

Typically, monocrystalline or polycrystalline Si, or the like is used as a semiconductor substrate 130 of a photovoltaic cell element. This semiconductor substrate 130 contains boron and the like to constitute a p-type semiconductor. Unevenness (texture, not shown) is formed on the light-receiving surface side by etching so as to inhibit the reflection of sunlight. Phosphorous and the like are doped on the light-receiving surface side, a diffusion layer 131 of an n-type semiconductor with a thickness on the order of submicrons is provided, and a p/n junction is formed on the boundary with the p-type bulk portion. Also, on the light-receiving surface side, an anti-reflection layer 132 such as silicon nitride with a film thickness of around 100 nm is provided on the diffusion layer 131 by a vapor deposition method.

Next, a light-receiving surface electrode 133 provided on the light-receiving surface side, a current collection electrode 134 and an output extraction electrode 135 formed on the back surface will be described. The light-receiving surface electrode 133 and the output extraction electrode 135 are formed from the paste composition for an electrode. Further, the current collection electrode 134 is formed from the aluminum electrode paste composition including glass powders. These electrodes are formed by applying the paste composition for a desired pattern by screen printing or the like, drying, and then sintering at about 600 to 850° C. in an atmosphere.

In the present invention, by using the above-described paste composition for an electrode, an electrode having excellent resistivity and contact resistivity can be formed even when the sintering is performed at a relatively low temperature.

Here, on the light-receiving surface side, the glass particles which are included in the paste composition for an electrode forming the light-receiving surface electrode 133 undergo a reaction (fire-through) with the anti-reflection layer 132, thereby electrically connecting (ohmic contact) the light-receiving surface electrode 133 and the diffusion layer 131.

In the present invention, by using the above-described paste composition for an electrode to form the light-receiving surface electrode 133, the light-receiving surface electrode 133 which includes copper as a conductive metal, inhibits the oxidation of copper, and has a low resistivity is formed with high productivity.

Further, on the back surface side, while sintering, aluminum in the aluminum electrode paste composition forming the current collection electrode 134 is diffused onto the back surface of the semiconductor substrate 130 to form an electrode component diffusion layer 136, and as a result, ohmic contact among the semiconductor substrate 130, the current collection electrode 134, and the output extraction electrode 135 can be obtained.

Figure 4:
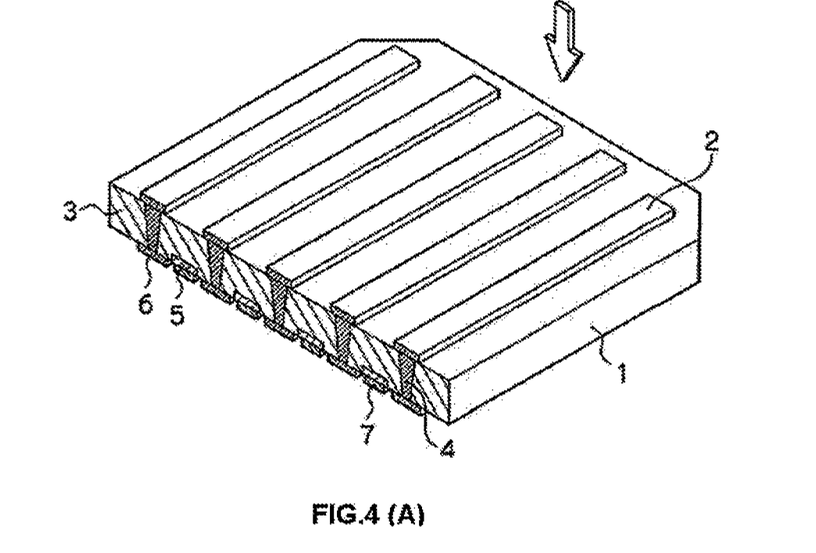

Furthermore, the perspective view (a) of the light-receiving surface and the AA cross-section structure, and the plane view (b) of the back surface side electrode structure of one example of the photovoltaic cell element which is another embodiment of the present invention are shown in FIG. 4.

As shown in FIG. 4(a), in a cell wafer 1 including a silicon substrate of a p-type semiconductor, a through-hole which passes through both sides of the light-receiving surface side and the back surface side is formed by laser drilling, etching, or the like. Further, a texture (not shown) improving the efficiency of incident light is formed on the light-receiving surface side. Also, the n-type semiconductor layer 3 by n-type diffusion treatment is formed on the light-receiving surface side, and an anti-reflection film (not shown) is formed on the n-type semiconductor layer 3. These are prepared by the same step as for a cell of a conventional crystal Si-type photovoltaic cell.

Next, the paste composition for an electrode of the present invention is filled in the inside of the through-hole previously formed by a printing method or an ink-jet method, and also, the paste composition for an electrode of the present invention is similarly printed in the grid shape on the light-receiving surface side, thereby forming a composition layer which forms the through-hole electrode 4 and the grid electrode 2 for current collection.

Here, in the paste used for filling and printing, a paste having a composition optimal for each process including viscosity is preferably used, but a paste have the same composition may be filled or printed in bulk.

On the other hand, a high-concentration doped layer 5 is formed on the opposite side of the light-receiving surface (back surface side) so as to prevent the carrier recombination. Here, as an impurity element forming the high-concentration doped layer 5, boron (B) or aluminum (Al) is used, and a p$^+$ layer is formed. This high-concentration doped layer 5 may be formed by carrying out a thermal diffusion treatment using, for example, B as a diffusion source in the process of preparing a cell before forming the anti-reflection film, or when using Al, it may also be formed by printing an Al paste on the opposite surface side in the printing process.

Thereafter, the paste composition for an electrode which is sintered at 650 to 850° C., and filled and printed on an anti-reflection film formed in the inside of the through-hole and on the light-receiving surface side can attain ohmic contact with the lower n-type layer by a fire-through effect.

Furthermore, as shown in the plane view of FIG. 4(b), the paste composition for an electrode according to the present invention is printed in stripe shapes on each of the n side and the p side, and sintered, and thus, the back surface electrodes 6 and 7 are formed on the opposite surface side.

In the present invention, the through-hole electrode 4, the grid electrode 2 for current collection, the back surface electrode 6, and the back surface electrode 7 are formed using the paste composition for an electrode, and thus, the through-hole electrode 4, the grid electrode 2 for current collection, the back surface electrode 6, and the back surface electrode 7, each of which includes copper as a conductive metal, inhibits the oxidation of copper, and has a low resistivity, are formed with high productivity.

Moreover, the paste composition for an electrode for a photovoltaic cell of the present invention is not restricted to the applications of photovoltaic cell electrodes, and can also be appropriately used in applications such as, for example, electrode wirings and shield wirings of plasma displays, ceramic condensers, antenna circuits, various sensors circuits, and heat dissipation materials of semiconductor devices.

EXAMPLES

Hereinbelow, the present invention will be described in detail with reference to Examples, but the present invention is not limited to these Examples. Further, unless otherwise specified, "parts" and "%" are based on mass.

Example 1

(a) Preparation of Paste Composition for Electrode

A phosphorous-containing copper alloy particles including 7% by mass of phosphorous is prepared, dissolved, made into powder by a water atomization method, then dried and classified. The classified powders were blended and subjected to deoxidation/dehydration treatments to prepare phosphorous-containing copper alloy particles including 7% by mass of phosphorous. Further, the particle diameter of the phosphorous-containing copper alloy particle (D50%) was 1.5 µm.

A glass including 3 parts of silicon dioxide ($SiO_2$), 60 parts of lead oxide (PbO), 18 parts of boron oxide ($B_2O_3$), 5 parts of bismuth oxide ($Bi_2O_3$), 5 part of aluminum oxide ($Al_2O_3$), and 9 parts of zinc oxide (ZnO) (hereinafter abbreviated as "G1" in some cases) was prepared. The glass G1 obtained had a softening point of 420° C. and a crystallization temperature of higher than 600° C.

By using the glass G1 obtained, glass particles having a particle diameter (D50%) of 1.7 µm were obtained.

Then, 85.1 parts of the thus obtained phosphorous-containing copper alloy particle, 1.7 parts of the glass particle and 13.2 parts of a terpineol (isomeric mixture) solution containing 3% by mass of ethyl cellulose (EC, weight average molecular weight of 190,000) were mixed and stirred in an agate mortar for 20 minutes to prepare a paste composition 1 for an electrode.

(b) Preparation of Photovoltaic Cell

A p-type semiconductor substrate having a film thickness of 190 µm, in which an n-type semiconductor layer, a texture, and an anti-reflection film (silicon nitride film) were formed on the light-receiving surface, was prepared, and cut to a size of 125 mm×125 mm. The paste composition 1 for an electrode obtained above was printed on the light-receiving surface for an electrode pattern as shown in FIG. 2, using a screen printing method. The pattern of the electrode was constituted with finger lines with a 150 µm width and bus bars with a 1.1 mm width, and the printing conditions (a mesh of a screen plate, a printing speed, a printing pressure) were appropriately adjusted so as to give a film thickness after sintering of 20 µm. The resultant was put into an oven heated at 150° C. for 15 minutes, and the solvent was removed by evaporation.

Subsequently, an aluminum electrode paste was similarly printed on the entire surface of the back surface by screen printing. The printing conditions were appropriately adjusted so as to give a film thickness after sintering of 40 µm. This was put into an oven heated at 150° C. for 15 minutes, and the solvent was removed by evaporation.

Thereafter, using a tunnel oven (manufactured by Noritake Co., Limited; single W/B conveyor tunnel furnace), a heat treatment (sintering) was performed in the atmosphere at the maximum sintering temperature of 850° C. for a retention time of 10 seconds to prepare a photovoltaic cell 1 in which desired electrodes were formed.

Example 2

A photovoltaic cell 2 was prepared in the same manner as in Example 1, except that the sintering conditions for the electrode formation were changed from 10 seconds at the maximum temperature of 850° C. to 15 seconds at the maximum temperature of 750° C.

Example 3

A paste composition 3 for an electrode and a photovoltaic cell 3 were prepared in the same manner as in Example 1, except that the particle diameter of the phosphorous-containing copper alloy particle was changed from 1.5 µm to 5.0 µm.

Example 4

A paste composition 4 for an electrode and a photovoltaic cell 4 were prepared in the same manner as in Example 1, except that the phosphorous content of the phosphorous-containing copper alloy particle was changed from 7% by mass to 6% by mass.

Example 5

A paste composition 5 for an electrode and a photovoltaic cell 5 were prepared in the same manner as in Example 1, except that the phosphorous content of the phosphorous-containing copper alloy particle was changed from 7% by mass to 8% by mass.

Example 6

A paste composition 6 for an electrode and a photovoltaic cell 6 were prepared in the same manner as in Example 3, except that a silver particle (particle diameter (D50%) of 3 µm; high-purity chemical product manufactured by Aldrich) was further added.

Specifically, the paste composition 6 for an electrode containing 75.0 parts of the phosphorous-containing copper alloy particle (phosphorous content of 7% by mass, particle diameter (D50%) of 5 µm), 10.1 parts of the silver particle, 1.7 parts of the glass particle (G1) and 13.2 parts of the terpineol (isomeric mixture) solution containing 3% by mass of ethyl cellulose (EC) was prepared, and the photovoltaic cell 6 was produced in the same manner as in Example 3 except that the thus obtained paste composition 6 for an electrode was used.

Examples 7 to 17

Paste compositions 7 to 17 for an electrode were prepared in the same manner as in Example 1, except that the phosphorous content, particle diameter (D50%) and content of the phosphorous-containing copper alloy particle, as well as the content of the silver particle, the type and content of the glass particle and the content of the terpineol solution containing 3% of ethyl cellulose (EC), were changed as shown in Table 1.

It is noted here that the glass particle (G2) consists of 45 parts of vanadium oxide ($V_2O_5$), 24.2 parts of phosphorus oxide ($P_2O_5$), 20.8 parts of barium oxide (BaO), 5 parts of antimony oxide ($Sb_2O_3$) and 5 parts of tungsten oxide ($WO_3$) and had a particle diameter (D50%) of 1.7 µm. Further, the softening point of this glass was 492° C. and the crystallization temperature was higher than 600° C.

Then, photovoltaic cells 7 to 11 having desired electrodes were each produced in the same manner as in Example 1, except that the respective paste compositions 7 to 17 for an electrode were used and the temperature and time of the heat treatment were changed as shown in Table 1.

Comparative Example 1

A paste composition C1 for an electrode was prepared in the same manner as in Example 1, except that the phosphorous-containing copper alloy particle was not used and the components were changed in accordance with the composition shown in Table 1.

A photovoltaic cell C1 was produced in the same manner as in Example 1, except that the paste composition C1 for an electrode not containing the phosphorous-containing copper alloy particle was used.

Comparative Example 2

A photovoltaic cell C2 was produced in the same manner as in Comparative Example 1, except that the sintering conditions for the electrode formation were changed from 10 seconds at the maximum temperature of 850° C. to 15 seconds at the maximum temperature of 750° C.

Comparative Example 3

A paste composition C3 for an electrode was prepared in the same manner as in Example 1, except that pure copper not containing phosphorus (phosphorous content: 0%) was used in place of the phosphorous-containing copper alloy particle.

A photovoltaic cell C3 was produced in the same manner as in Example 1, except that the thus obtained paste composition C3 for an electrode was used.

Comparative Example 4

A photovoltaic cell C4 was produced in the same manner as in Comparative Example 1, except that the sintering conditions for the electrode formation in Comparative Example 3 were changed from 10 seconds at the maximum temperature of 850° C. to 20 seconds at the maximum temperature of 700° C.

TABLE 1

| Example | Phosphorous-containing copper alloy particles | | | Silver particles | | Glass particles Type | 3% EC-containing terpineol | | Sintering Condition | |
|---|---|---|---|---|---|---|---|---|---|---|
| | Content (parts) | Content of Phosphorous (wt %) | Particle diameter (D50%) (μm) | Content (parts) | Particle diameter (D50%) (μm) | | Content (parts) | solution (parts) | top temperature at sintering | Treatment time at top temperature |
| Example 1 | 85.1 | 7 | 1.5 | 0 | — | G1 | 1.7 | 13.2 | 850 | 10 |
| Example 2 | 85.1 | 7 | 1.5 | 0 | — | G1 | 1.7 | 13.2 | 750 | 15 |
| Example 3 | 85.1 | 7 | 5.0 | 0 | — | G1 | 1.7 | 13.2 | 850 | 10 |
| Example 4 | 85.1 | 6 | 1.5 | 0 | — | G1 | 1.7 | 13.2 | 850 | 10 |
| Example 5 | 85.1 | 8 | 1.5 | 0 | — | G1 | 1.7 | 13.2 | 850 | 10 |
| Example 6 | 75.0 | 7 | 5.0 | 10.1 | 3 | G1 | 1.7 | 13.2 | 850 | 10 |
| Example 7 | 75.0 | 7 | 5.0 | 10.1 | 3 | G1 | 1.7 | 13.2 | 750 | 15 |
| Example 8 | 59.5 | 7 | 5.0 | 25.6 | 3 | G1 | 1.7 | 13.2 | 850 | 10 |
| Example 9 | 39.2 | 7 | 5.0 | 45.9 | 3 | G1 | 1.7 | 13.2 | 850 | 10 |
| Example 10 | 75.0 | 7 | 5.0 | 10.1 | 3 | G2 | 2.0 | 13.2 | 850 | 10 |
| Example 11 | 73.5 | 7 | 5.0 | 9.9 | 3 | G2 | 3.4 | 13.2 | 850 | 10 |
| Example 12 | 75.0 | 8 | 1.5 | 10.1 | 3 | G2 | 1.7 | 13.2 | 850 | 10 |
| Example 13 | 75.0 | 8 | 1.5 | 10.1 | 3 | G2 | 1.7 | 13.2 | 750 | 15 |
| Example 14 | 75.0 | 8 | 1.5 | 10.1 | 3 | G2 | 1.7 | 13.2 | 700 | 20 |
| Example 15 | 73.5 | 8 | 1.5 | 9.9 | 3 | G1 | 3.4 | 13.2 | 850 | 10 |
| Example 16 | 79.3 | 7 | 5.0 | 0 | — | G1 | 1.7 | 19.0 | 850 | 10 |
| Example 17 | 53.7 | 7 | 5.0 | 25.6 | 3 | G1 | 1.7 | 19.0 | 750 | 15 |
| Comp. Example 1 | — | — | — | 85.1 | 3 | G1 | 1.7 | 13.2 | 850 | 10 |
| Comp. Example 2 | — | — | — | 85.1 | 3 | G1 | 1.7 | 13.2 | 750 | 15 |
| Comp. Example 3 | 85.1 | 0 | 1.5 | 0 | — | G1 | 1.7 | 13.2 | 850 | 10 |
| Comp. Example 4 | 85.1 | 0 | 1.5 | 0 | — | G1 | 1.7 | 13.2 | 700 | 20 |

<Evaluation>

The photovoltaic cells prepared were evaluated with a combination of WXS-155 S-10 manufactured by Wacom-Electric Co., Ltd. as artificial sunlight and a measurement device of I-V CURVE TRACER MP-160 (manufactured by EKO INSTRUMENT CO., LTD.) as a current-voltage (I-V) evaluation and measurement device. Eff (conversion efficiency), FF (fill factor), Voc (open voltage), and Jsc (short circuit current) indicating the power generation performances as a photovoltaic cell were obtained by carrying out the measurement in accordance with each of JIS-C-8912, JIS-C-8913, and JIS-C-8914. Each of the values measured are shown in Table 2 in terms of a relative value when the value measured in Comparative Example 1 was taken as 100.0.

Comparative Examples 3 and 4 were unmeasurable due to increase of the resistivity of the each electrode by the oxidation of copper particles.

TABLE 2

| | Power generation performance as photovoltaic cell | | | |
|---|---|---|---|---|
| Example | Eff (relative value) Conversion efficiency | FF (relative value) Fill factor | Voc (relative value) Open voltage | Jsc (relative value) Short circuit current |
| Example 1 | 100.6 | 100.2 | 100.0 | 101.1 |
| Example 2 | 99.8 | 98.9 | 95.9 | 100.1 |
| Example 3 | 100.3 | 101.1 | 99.8 | 99.8 |
| Example 4 | 101.5 | 100.8 | 101.2 | 102.2 |
| Example 5 | 99.8 | 99.7 | 100.1 | 99.6 |
| Example 6 | 101.1 | 100.2 | 98.2 | 101.2 |
| Example 7 | 100.9 | 100.1 | 99.1 | 100.4 |
| Example 8 | 101.8 | 100.8 | 100.1 | 99.8 |
| Example 9 | 102.8 | 102.5 | 100.3 | 103.0 |
| Example 10 | 102.3 | 100.9 | 100.5 | 100.3 |
| Example 11 | 102.2 | 101.1 | 100.2 | 99.9 |
| Example 12 | 99.7 | 98.9 | 98.0 | 100.1 |
| Example 13 | 99.1 | 99.0 | 98.4 | 99.2 |
| Example 14 | 97.9 | 98.1 | 95.5 | 99.2 |
| Example 15 | 101.1 | 99.4 | 100.1 | 100.3 |
| Example 16 | 100.0 | 99.7 | 99.6 | 100.3 |
| Example 17 | 99.2 | 98.0 | 98.2 | 99.4 |
| Comparative Example 1A | 100.0 | 100.0 | 100.0 | 100.0 |

TABLE 2-continued

| | Power generation performance as photovoltaic cell | | | |
|---|---|---|---|---|
| Example | Eff (relative value) Conversion efficiency | FF (relative value) Fill factor | Voc (relative value) Open voltage | Jsc (relative value) Short circuit current |
| Comparative Example 2 | 68.7 | 70.4 | 80.2 | 69.9 |
| Comparative Example 3 | — | — | — | — |
| Comparative Example 4 | — | — | — | — |

The performances of the photovoltaic cells prepared in Examples 1 to 17 were about the same or superior as compared to the measured values of Comparative Example 1. Particularly, the photovoltaic cells 1 to 5 and 16 exhibited high power generation performances although their electrodes were formed without silver particle.

Further, when the X-ray diffraction was measured by X-ray diffraction method with CuKα ray, the light-receiving surface electrodes of the photovoltaic cells 1 to 5 and 16 showed diffraction peaks characteristic to copper at least at diffraction angles (2θ, CuKα ray) of 43.4°, 50.6° and 74.2°. As the reason for such detection of copper from the light-receiving surface electrodes, the following principle is considered.

First, in the paste compositions for an electrode 1 to 5 and 16, the phosphorous-containing copper alloy particles have a phosphorous content of 6% by mass to 8% by mass. Based on the Cu-P phase diagram, this part is composed of α-Cu phase and $Cu_3P$ phase. In the early stage of sintering, the α-Cu phase is oxidized to $Cu_2O$. This $Cu_2O$ is believed to be reduced back to α-Cu. Here, it is thought that the $Cu_3P$ phase contained in the phosphorous-containing copper alloy particle or phosphorus derived from oxidized $Cu_3P$ phase contributes to this reduction reaction.

Accordingly, as shown in Examples 1 to 17, in those paste compositions for an electrode in which phosphorous-containing copper alloy particles having a phosphorous content of 6% by mass to 8% by mass were used, it is thought that, even when the retention time at the maximum temperature was set to 10 to 20 seconds, oxidation of copper was suppressed during the sintering, so that electrodes having a low resistivity were formed. Further, since sintering of the phosphorous-containing copper alloy particles is more advanced by extending the sintering time, not only a more compact electrode having a low resistivity can be formed but also fire-through can be performed more effectively; therefore, an effect that the ohmic contact property between an electrode and a semiconductor substrate is improved can also be attained.

Example 18

Using the paste composition 1 for an electrode obtained in the above, a photovoltaic cell 18 having the structure shown in FIG. 4 was prepared. Here, the heating treatment was performed at 850° C. for 10 seconds.

When the thus obtained photovoltaic cell was evaluated in the same manner as described above, the photovoltaic cell was found to exhibit excellent properties in the same manner as described above.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A paste composition for an electrode, the paste composition comprising:
   phosphorous-containing copper alloy particles wherein the content of phosphorous is from 6% by mass to 8% by mass;
   glass particles;
   a solvent; and
   a resin.

2. The paste composition for an electrode according to claim 1, wherein the glass particles have a glass softening point of 600° C. or lower and a crystallization starting temperature of higher than 600° C.

3. The paste composition for an electrode according to claim 1, wherein a particle diameter of the phosphorous-containing copper alloy particles is from 0.4 μm to 10 μm in terms of a particle diameter when the cumulative mass is 50%.

4. The paste composition for an electrode according to claim 1, wherein a particle diameter of the glass particles is from 0.5 μm to 10 μm in terms of a particle diameter when the cumulative mass is 50%.

5. The paste composition for an electrode according to claim 1, wherein a ratio of a particle diameter of the glass particle (D50%) with respect to a particle diameter of the phosphorous-containing copper alloy particle (D50%) is 0.05 to 100.

6. The paste composition for an electrode according to claim 1, further comprising silver particles.

7. The paste composition for an electrode according to claim 6, wherein the content of the silver particles is from 5% by mass to 65% by mass, with respect to a total content of the phosphorous-containing copper alloy particles and the silver particles is 100% mass.

8. The paste composition for an electrode according to claim 6, wherein the total content of the phosphorous-containing copper alloy particles and the silver particles is 70% by mass to 94% by mass, the content of the glass particles is 0.1% by mass to 10% by mass, and the total content of the solvent and the resin is 3% by mass to 29.9% by mass, with respect to the paste composition.

9. A photovoltaic cell having an electrode, wherein the electrode is formed by sintering the paste composition for an electrode according to claim 1, after the paste composition has been applied to a silicon substrate.

* * * * *